United States Patent [19]
Wong

[11] Patent Number: 6,154,157
[45] Date of Patent: Nov. 28, 2000

[54] NON-LINEAR MAPPING OF THRESHOLD VOLTAGES FOR ANALOG/MULTI-LEVEL MEMORY

[75] Inventor: Sau C. Wong, Hillsborough, Calif.

[73] Assignee: SanDisk Corporation, Sunnyvale, Calif.

[21] Appl. No.: 09/200,205

[22] Filed: Nov. 25, 1998

[51] Int. Cl.$^7$ ...................................................... H03M 1/00
[52] U.S. Cl. ........................... 341/110; 341/154; 341/126
[58] Field of Search ................................... 341/110, 154, 341/126

[56] References Cited

U.S. PATENT DOCUMENTS

| | | | |
|---|---|---|---|
| 5,060,178 | 10/1991 | Kato et al. | 364/600 |
| 5,986,633 | 11/1999 | Takeuchi | 345/115 |
| 6,016,113 | 1/2000 | Binder | 341/131 |

*Primary Examiner*—Brian Young
*Assistant Examiner*—Jason L W Kost
*Attorney, Agent, or Firm*—Majestic, Parsons, Siebert & Hsue

[57] ABSTRACT

An analog-to-analog converter uses programmable conversion arrays containing non-volatile memory cells to provide references that depend on the threshold voltages of the memory cells, with the type of conversion dependent on the threshold voltages of the cells. An analog input signal is applied to an analog-to-digital conversion array for conversion to a digital signal. The digital signal is applied to a digital-to-analog conversion array for conversion to an analog output signal. A memory cell in the digital-to-analog conversion array is selected corresponding to the digital signal and reads the memory cell to generate the analog output signal, which is equal to or has a one-to-one correspondence with the threshold voltage of the memory cell. The conversion arrays can be programmed with suitable threshold voltages to implement desired conversions, such as logarithmic conversion for voice applications or random conversions for signal encryption.

35 Claims, 8 Drawing Sheets

NON-LINEAR MAPPING OF THRESHOLD VOLTAGES FOR ANALOG/MULTI-LEVEL MEMORY

CROSS-REFERENCE TO RELATED APPLICATIONS

This application relates to commonly-owned U.S. patent app. Ser. No. 09/159,704, entitled "PROGRAMMABLE DATA CONVERSION ARRAYS", bearing attorney docket No. M-6045, filed Sep. 23, 1998, and Ser. No. 09/200,500, entitled "DATA ENCRYPTION AND SIGNAL SCRAMBLING USING PROGRAMMABLE CONVERSION ARRAYS", bearing attorney docket No. M-7059, filed concurrently, both of which are incorporated in their entirety.

BACKGROUND

1. Field of the Invention

This invention relates to signal processing, and in particular to analog-to-analog signal conversion using analog/multi-level memory arrays.

2. Description of Related Art

Many communication systems convert signals from one format to another. For example, audio and image processing systems often use analog-to-digital converters (ADCs) to convert analog audio or image signals to digital samples for digital processing and subsequent storage in memory or transmission along communication channels. The processed or stored digital data can then be converted back to an analog signal by digital-to-analog converters (DACs) for play-back or display, resulting in an analog-to-analog conversion. Analog-to-analog conversion can also be used to convert analog signals from one format to another format for a variety of uses such as audio transmissions or analog data encryption.

First, conversion to a suitable digital format includes sampling the analog waveform, quantizing each of the sampled values to one of M discrete levels, and encoding each quantized analog value into a binary data stream. FIG. 1 is a block diagram of a conventional ADC 100 that quantizes a sampled analog value Ain into one of M (i.e., x+1) discrete values and then encodes the discrete value into an n-bit digital output signal Dout. ADC 100 includes a reference voltage source 110, comparators 120, and an encoder 130. In ADC 100, reference voltage source 110 includes series-connected resistors R0 to Rx that generate x+1 reference voltages V0 to Vx, where x is equal to $2^n - 1$. The reference voltages V0 to Vx represent the possible quantized levels of the sampled analog input signal Ain.

To convert analog signal Ain into the n-bit digital output signal Dout, comparators 120 simultaneously compare analog signal Ain to reference voltages V0 to Vx. The relative values of resistors R0 to Rx determine the step size between successive reference voltages. For example, if R0=R1= . . . =Rx, then the step size is the same between each reference voltage, i.e., linear or uniform quantization. For any reference voltage that is greater than the voltage of signal Ain, the comparator 120 associated (i.e., connected) with that reference voltage asserts a corresponding one of binary signals C0 to Cx high to encoder 130. Encoder 130 provides digital output signal Dout with a value that depends on which of signals C0 to Cx are high. The digital signal Dout can then be processed, stored, and/or transmitted. The number (x+1) of comparators 120 in ADC 100 depends exponentially on the number (n) of bits in signal Dout. Accordingly, for applications requiring a large number of bits, ADC 100 requires many comparators, and the circuit area and power required for ADC 100 can be significant.

DACs are used to reconstruct the analog signal from a digital input signal Din and are generally less complex than ADCs. FIG. 2 shows a DAC 200 including reference voltage source 110, a decoder 230 that receives digital input signal Din, and transistors 220 coupled between reference voltages V0 to Vx and a terminal for a reconstructed analog output signal Aout. To perform a digital-to-analog conversion, decoder 230 receives digital input signal Din and selects and turns on the one of transistors 220 that corresponds to the value of signal Din. Accordingly, analog output signal Aout has a voltage equal to the one of reference voltages V0 to Vx that corresponds to the selected transistor 220.

Many other implementations of ADCs and DACs are known, such as switched capacitance and successive approximation techniques. Generally, these converters require substantial overhead and circuit area. In particular, when an analog-to-analog conversion is desired, a suitable converter circuit first uses an ADC to convert an analog input Ain to a digital output Dout. This digital output is then used as the digital input to a DAC for conversion to the desired analog signal Aout. Thus, both an ADC and a DAC are needed, thereby further increasing the overhead and circuit area of the analog-to-analog converter.

If the desired analog-to-analog conversion is not a one-to-one mapping, the reconstructed analog signal Aout is typically not an exact replica of the original analog signal Ain, which may be due to errors introduced during transmission or quantization. In general, the more levels M (x+1) of available quantized values, the less quantization error is present in the reconstructed analog signal. However, large numbers of levels require higher transmission bandwidths and may be impractical to implement due to system constraints on components of such an ADC. Furthermore, quantization errors may have more severe effects in certain applications, such as voice or audio transmission or recordation. Assuming audible or recognizable speech requires a minimum signal-to-noise (S/N) ratio, low voice signals are more susceptible to quantization errors than loud voice signals. Furthermore, voice signals are much more likely to have voltage amplitudes near zero, i.e., most voice signals are low voltage signals with only occasional bursts near the high end, which results in the adverse effects of quantization errors occurring much more frequently during a speech transmission or recording. Also, human hearing is more sensitive to low amplitude than high amplitude voice signals. Therefore, a linear mapping of input voltages to output voltages for analog-to-digital conversion can introduce substantial errors in low amplitude voice signals such that the subsequent digital-to-analog conversion results in an unacceptable speech quality.

As is well known, by using non-linear mapping, non-uniform quantization of input voltages to output voltages, soft voice signals are converted to signals that have a proportionally higher resolution per quantized level than loud voice signals in order to achieve a more optimum S/N ratio across the dynamic range of the voice signal. Non-uniform quantization can be achieved by first compressing the analog signal according to a logarithmic expression, such as a µ-law or A-law compression characteristic, and then uniformly quantizing the signal. A normalized curve of a µ-law compression, with µ=255, is shown in FIG. 3. (Note that only the positive quadrant is shown. The curve is symmetrical, such that negative input voltages have negative output voltages with the same characteristic curve as for positive input voltages.) With uniform quantization, it is seen from FIG. 3 that the compressed output is sampled at much shorter steps when the input signal is low and at increasingly longer steps when the input signal is high. The result is a signal in which low amplitude voltages have less quantization error and high amplitude voltages have more quantization error, which is acceptable for voice or speech applications. After compression and quantization (A/D conversion), the digital signal is transmitted over or recorded on a suitable medium. The digital signal is then converted back to analog (D/A conversion) and expanded through the inverse of the compression characteristic to restore the signal to the correct relative analog voltage levels.

As a result, circuits which perform companding (companders) are important in audio signal processing for increasing the overall S/N ratio and reducing the quantization error of low amplitude voice signals, which is the dominant portion of the voice signal range. However, many conventional companders can be relatively large and/or expensive and complicated, such as binary-weighted capacitor arrays using charge redistribution or ADC 100 (FIG. 1) and DAC 200 (FIG. 2) with precise different resistances for resistors R0 to Rx. For example, to implement a logarithmic compression with ADC 100, the low reference voltages need to be precise with small voltage differences between successive reference voltages in order to accurately compress low amplitude analog signals. Consequently, the resistances of the corresponding resistors must be precisely maintained and track each other due to process, temperature, and power supply variations, which can increase both the cost and complexity of the ADC.

SUMMARY

In accordance with the invention, an analog-to-analog conversion is obtained by converting an input analog signal to a corresponding digital signal and then converting or mapping the digital signal to a desired analog signal utilizing a programmable analog/multi-level memory array (conversion array), with the mapping defined by the threshold voltages of the memory cells in the memory array. The analog-to-analog conversion can be performed with converters having a digital-to-analog converter (DAC) and an analog-to-digital converter (ADC), where the conversion arrays contain non-volatile memory or reference cells having a set of threshold voltages that provide references for conversions. A conversion array may be divided into multiple subsets of the reference cells where each reference cell in a subset corresponds to a digital value and has a threshold voltage that is equal to or has a one-to-one correspondence with the analog voltage that a conversion maps to the digital value. An ADC applies an analog input signal to the gates of reference cells in a subset and generates a digital signal according to which reference cells conduct. In particular, when the analog input signal is applied, each reference cell has a binary state, either conductive or non-conductive, and generation of the digital signal simply requires digital encoding of binary signals indicating the states of the reference cells. With this approach, the ADC does not require comparators which can significantly reduce the size, power consumption, and the conversion time of the ADC. A DAC that contains a conversion array selects a memory cell corresponding to the digital value from the ADC and reads the selected memory cell to generate an analog output signal having a voltage that is equal to or has a one-to-one correspondence with the threshold voltage of the memory cell, resulting in the desired analog-to-analog conversion. The DAC can use the same conversion array as an ADC to ensure that the DAC inverts the conversion that the ADC performs.

The conversion array may include Read-Only-Memory (ROM) cells, where the structure (e.g., based on channel dopant concentration) of each ROM cell sets the cell's threshold voltage, or electrically programmable non-volatile memory cells. The set of threshold voltages in the conversion array controls the conversion or conversions implemented, such as analog-to-analog linear or non-linear conversions. In particular, the threshold voltages can be programmed to implement a logarithmic conversion, such as A-law, $\mu$-law, or other conversion schemes for audio, voice, image or other applications. The compressed analog signal can then be transmitted or written and stored in another analog/multi-level memory array for later playback. Another memory array can be used to convert the analog signal back to the original format, i.e., performing an inverse transformation of the original conversion array. Furthermore, random threshold voltages can be programmed in the conversion array to encrypt signals prior to transmission to a desired destination for secure communication. Upon receipt, the encrypted signal can be decoded using an inverse conversion array. Thus, electrically programming the threshold voltages of memory cells in a conversion array allows the type of conversion to be changed for a variety of needs. Such an in-system programmability (ISP) is beneficial because the desired conversion can be changed on the fly or from a remote location, such as with telephone connections with the proper programming capabilities, by simply erasing and reprogramming threshold voltages in the memory cells of the conversion array.

One embodiment of the invention is an analog-to-analog converter (AAC) that includes a plurality of transistors having a plurality of different threshold voltages. For analog-to-digital conversions, an input circuit for the converter applies an analog input signal to the gates of the transistors, and an encoder generates a digital output signal that represents a value that depends on which of the transistors conduct when the analog input signal is applied. The transistors are typically floating gate transistors or other transistors having programmable threshold voltages, and the transistors may be in an array including multiple rows and columns of memory cells. In one embodiment, the transistors are in a conversion array having multiple rows, where each row contains transistors with a sequence of threshold voltages that define a different conversion table. A conventional row decoder can select a row accessed from the conversion array during a conversion and thereby select from among multiple conversions implemented in the converter.

The digital output from the analog-to-digital conversion is then used for digital-to-analog conversion, which includes a read circuit that reads a threshold voltage of a transistor and generates an analog output signal having a voltage that indicates the threshold voltage read. A select circuit receives the digital signal and selects a memory cell that is in the conversion array corresponding to the value of the digital signal. The read circuit reads the threshold voltage of selected memory cell and outputs this analog threshold voltage to complete a digital-to-analog conversion. The end result is the desired analog-to-analog conversion.

In another embodiment, an AAC uses a single memory or conversion array for an analog-to-digital conversion followed by a digital-to-analog conversion. For the first conversion, AAC converts an analog input signal to a digital output signal using the desired row of the memory array.

This digital output signal is used for the second conversion, but the second conversion uses a different row of the array to define the conversion of the digital signal to the desired analog output signal. The result of the two conversions can complete any desired mapping of voltages of an analog input signal to voltages of a different analog output signal.

The analog output signal can then be stored in an analog/multi-level memory or transmitted along a communication medium to a desired destination. At the desired destination, the received analog signal can go through another analog-to-analog conversion to reconstruct the signal back to the original signal format. The signal is reconstructed, for example, with similar circuits and methods described above, with the exception that the memory array for reconversion implements the inverse function of the original conversion, i.e., the memory cells forming the array are programmed with threshold voltages that are the inverse of the threshold voltages of the memory cells in the original conversion array. Instead of separate conversion and storage arrays, the analog/multi-level memory can include both the storage array and the conversion array. The storage and conversion arrays can be separate structures or portions of a larger array. When writing a data value, a selection circuit coupled to the conversion array selects from the conversion array a memory cell with an address that corresponds to the input data, and a read circuit reads the selected memory cell to generate an analog output indicating the threshold voltage of the selected memory cell. To store the data value, a programming circuit then programs a selected memory cell in the storage array. For a read operation, the read circuit reads a selected memory cell in the storage array and applies the analog output signal resulting from the read to control gates of memory cells in the conversion array. An encoder coupled to the conversion array generates a digital output signal having a value determined according to which of the memory cells in the conversion array conduct when the analog output signal is applied.

The present invention will be more fully understood upon consideration of the detailed description below, taken together with the accompanying drawings.

BRIEF DESCRIPTION OF THE DRAWINGS

Use of the same reference symbols in different figures indicates similar or identical items.

DETAILED DESCRIPTION OF THE PREFERRED EMBODIMENTS

In accordance with an aspect of the invention, an analog/multi-level memory array is programmed with threshold voltages Vts that are a non-linear or random function of input voltages such that analog input voltages to the array have a non-linear correspondence with the threshold voltages of memory cells in the memory or conversion array. Applying an analog input voltage signal to the memory array causes memory cells with a lower threshold voltage than the analog input voltage to conduct. By determining which memory cells conduct and which do not conduct, a converted digital representation of the input signal can be obtained. This digital signal is then used to select a corresponding reference cell in another memory or conversion array. The threshold voltage of the selected reference is read, which corresponds to the desired conversion to analog. By applying the converted analog voltage to an analog/multi-level memory array which contains memory cells programmed with the inverse of the conversion, the format of the original signal can then be obtained.

Figure 4:
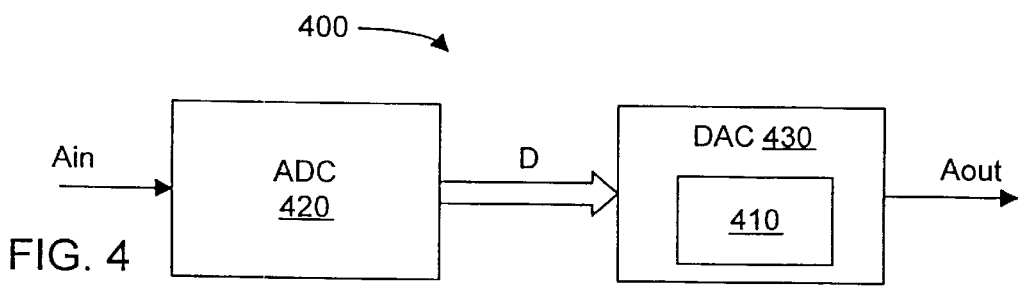
FIG. 4 is a block diagram of an analog-to-analog converter according to an aspect of the present invention.

FIG. 4 shows a system 400 for converting an analog signal Ain to a non-linear analog signal Aout using a non-volatile analog/multi-level memory array 410. System 400 includes an analog-to-digital converter (ADC) 420 and a digital-to-analog converter (DAC) 430 that utilizes memory array 410. ADC 420 converts input analog signal Ain to a digital output signal D. DAC 430 then converts digital signal D to a desired analog signal Aout by reading the threshold voltage of the memory cell in the array 410 that corresponds to the digital signal D. The magnitudes of Ain and Aout are not necessarily the same. For example, Aout can be a non-linear representation of Ain, such as according to $\mu$-law or A-law compression characteristics, high-level voltage shifting of Ain, or a random conversion of Ain.

Figure 5:
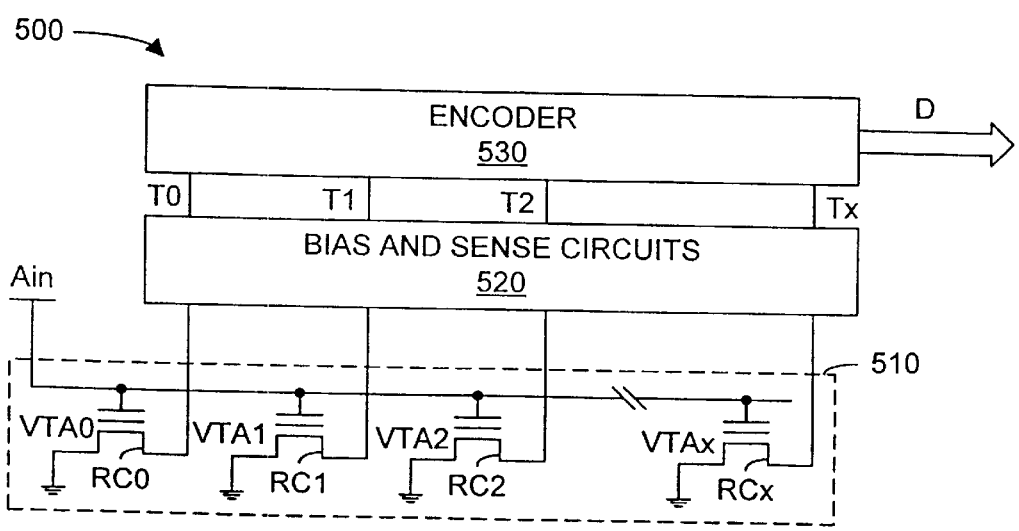
FIGS. 5, 6, 7A, and 7B are block diagrams of programmable analog-to-digital converters in accordance with alternative embodiments of the present invention.

FIG. 5 shows an ADC 500 suitable for use as ADC 420 of FIG. 4. ADC 400 includes a non-volatile memory array 510 (sometimes referred to herein as an analog conversion array) that provides programmable references for signal conversions. The analog conversion array, being programmable, allows the user or manufacturer to select or change the type of conversion implemented in the ADC 500 at any time by reprogramming the threshold voltages of the memory cells in the conversion array or table. ADC 500 includes analog conversion array 510 containing reference cells RC0 to RCx with respective threshold voltages VTA0 to VTAx. The number x is equal to $2^n-1$, where n is the number of bits in an output digital signal D from ADC 500. In FIG. 5, each reference cell RCi, for i between 0 and x, is an N-channel floating gate transistor that is electrically programmed to an associated threshold voltage VTAi, but alternative embodiments use other types of memory cells. Memory cells having electrically programmable threshold voltages permit changing or reprogramming of a conversion as described below, but ROM cells having threshold voltages that are set or fixed during circuit fabrication are also suitable. Reference cells RC0 to RCx have control gates coupled together by a row line to form a row. ADC 500 uses a row of reference cells to facilitate simultaneous application of the same control gate voltage to all reference cells RC0 to RCx. Other array configurations are possible, particularly in embodiments of ADC 500 that do not require simultaneous application of the same control gate voltage to all reference cells. The drains of reference cells RC0 to RCx are coupled to bias and sense circuits 520 and an encoder 530.

During operation of ADC 500, the sources of reference cells RC0 to RCx are grounded, bias and sense circuits 520 bias the drains of reference cells RC0 to RCx at a positive voltage, and the control gates of reference cells RC0 to RCx receive analog input signal Ain to be converted. The reference cells that have threshold voltages lower than the voltage of analog input signal Ain conduct, which causes output binary signals T0 to Tx from sense amplifiers to go high. Encoder 530 determines which of reference cells RC0 to RCx conduct and which do not conduct and, based on that determination, generates digital output signal D.

Figure 6:
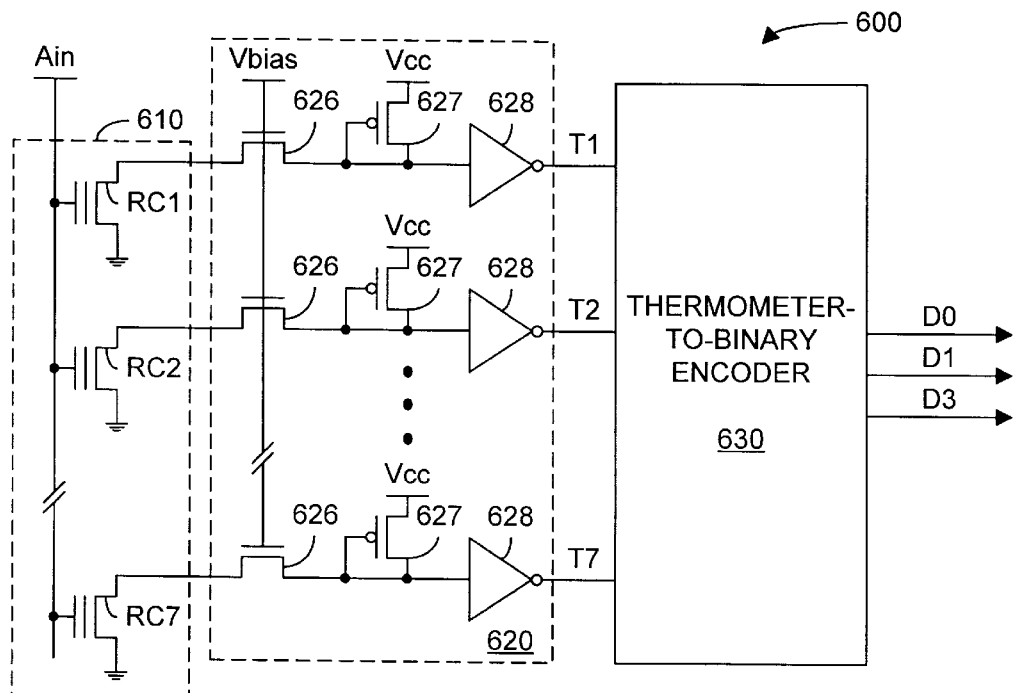

FIG. 6 shows an illustrative embodiment of an ADC 600 having an analog conversion array 610 for converting an analog input signal Ain to a 3-bit digital output signal D. Array 610 includes seven reference cells RC1 to RC7. Alternatively, as illustrated in FIG. 5, a conversion array for an n-bit data output signal includes $2^n$ reference cells RC0 to RCx that respectively correspond to digital values zero to $2^n-1$. However, reference cell RC0 is not required if any analog voltage below the threshold voltage of reference cell RC1 is presumed to have value zero.

In ADC 600, bias and sense circuits 620 include drain-coupled p-channel pull-up transistors 627 and n-channel cascoding transistors 626 for biasing reference cells RC1 to RC7 in conversion array 610. Pull-up transistors 627 have drains and gates connected together and sources coupled to a supply voltage Vcc (typically about 5V, 3V, or lower). Each cascading transistor 626 has a gate bias voltage Vbias of about 1.5 volts and serves to connect the drain of an associated reference cell to the drain of an associated pull-up transistor 627. Each pull-up transistor 627 maintains a high voltage on the input terminal of an associated inverter 628 unless an associated reference cell conducts. When a reference cell coupled to the drain of a pull-up transistor 627 conducts, the reference cell pulls down the voltage on the input terminal of the associated inverter 628. Thus, inverters 628 output binary signals T1 to T7 indicating whether respective reference cells RC1 to RC7 conduct.

An encoder 630 generates output signal D from binary signals T1 to T7. For ADC 600, encoder 630 is a thermometer-to-binary encoder that generates a 3-bit digital output signal D indicating which of reference cells RC1 to RC7 conduct. Thermometer-to-binary encoder 630 implements the digital encoding listed in Table 1.

TABLE 1

Thermometer-to-Binary Encoding

| Thermometer | | | | | | | Binary | | |
|---|---|---|---|---|---|---|---|---|---|
| T1 | T2 | T3 | T4 | T5 | T6 | T7 | D2 | D1 | D0 |
| 0 | 0 | 0 | 0 | 0 | 0 | 0 | 0 | 0 | 0 |
| 1 | 0 | 0 | 0 | 0 | 0 | 0 | 0 | 0 | 1 |
| 1 | 1 | 0 | 0 | 0 | 0 | 0 | 0 | 1 | 0 |
| 1 | 1 | 1 | 0 | 0 | 0 | 0 | 0 | 1 | 1 |
| 1 | 1 | 1 | 1 | 0 | 0 | 0 | 1 | 0 | 0 |
| 1 | 1 | 1 | 1 | 1 | 0 | 0 | 1 | 0 | 1 |
| 1 | 1 | 1 | 1 | 1 | 1 | 0 | 1 | 1 | 0 |
| 1 | 1 | 1 | 1 | 1 | 1 | 1 | 1 | 1 | 1 |

Methods for designing digital logic which implement the encoding of Table 1 are well known.

Figure 7A:
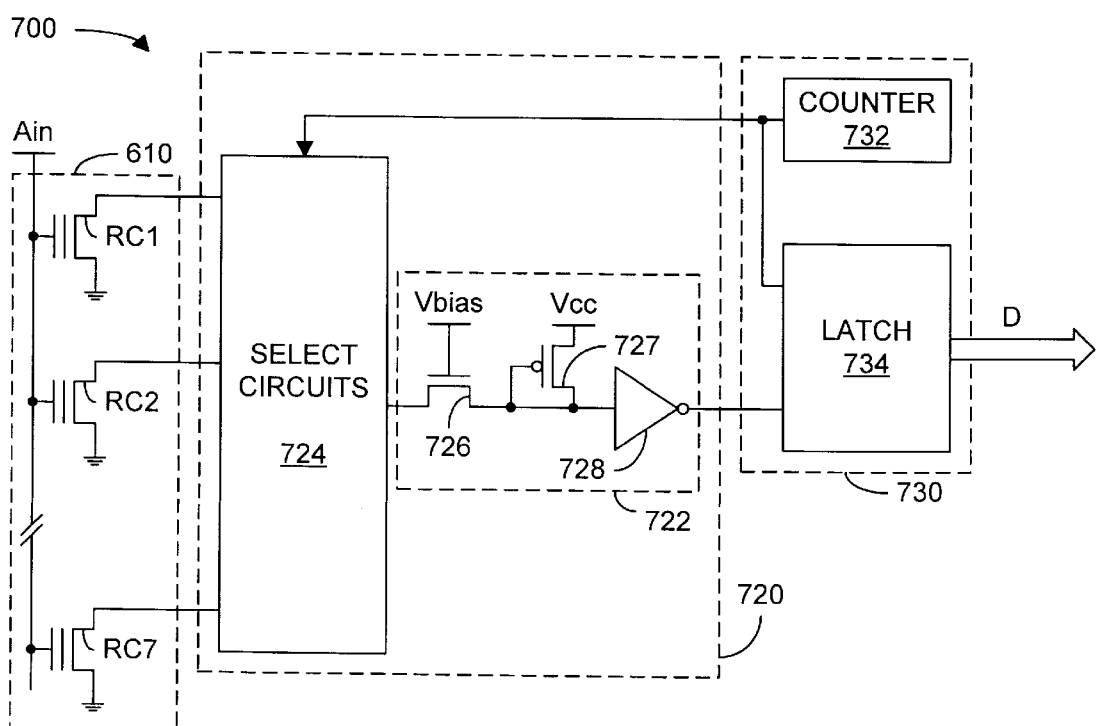

FIG. 7A illustrates an ADC 700 having a conversion array 610, sense and bias circuits 720, and an encoder 730, which is also suitable for ADC 420 of FIG. 4. For ADC 700, bias and sense circuits 720 sequentially determine the conductivity state of each of reference cells RC1 to RC7 in array 610 while analog input signal Ain is applied to the control gates of reference cells RC1 to RC7. (Again the example of a 3-bit digital output signal is described, but digital output signal D can have any size through appropriate expansion of conversion array 610 and circuits 720 and 730.) For the sequential determination, bias and sense circuits 720 include select circuits 724 and a sense circuit 722. Select circuits 724 include a column decoder that selects a reference cell that an address signal identifies. Such column decoders are well known for memories. When select circuit 724 selects a reference cell, sense circuit 722 determines the conductivity state of the selected reference cell. Encoder 730 generates digital output signal D from a serial signal indicating the conductivity states of the reference cells. Sequentially biasing or testing reference cells in this fashion can significantly reduce the required power and the required circuit area when compared to sensing all of the reference cells in parallel. In particular, ADC 700 requires only a single sense circuit 722 rather instead of $2^n$ sense circuits which operate in parallel to simultaneously determine all of the conductivity states.

In the illustrated embodiment of ADC 700, sense circuit 722 includes transistors 726 and 727 and an inverter 728. Alternatively, ADC 700 could use any other type sense circuit such as those that are well known for memories such as Flash memories. Select circuits 724 select a reference cell according to the address signal and connect the selected reference cell through transistor 726 to the input node of inverter 727. Pull-up transistor 727 pulls up the voltage on the input terminal of inverter 728 unless the selected reference cell conducts. When the selected reference cell conducts, the reference cell pulls down the voltage on the input terminal of inverter 728. Thus, the output signal from inverter 728 indicates whether the currently selected reference cell conducts.

Encoder 730 includes a counter 732 and a multi-bit latch 734. Counter 732 provides the address signal to select circuits 724 in bias and sense circuits 720. For signal conversion, a clock signal causes counter 732 to sequentially count up from zero. When the count in counter 732 crosses the boundary between the addresses of conductive reference cells and the addresses of non-conductive reference cells, a transition in the output signal from inverter 728 causes latch 734 to register the count signal from counter 732. This count signal is the digital output signal D. For example, if that input signal Ain has a voltage at or just above the threshold voltage VT2 of reference cell RC2, input signal Ain should be converted to the digital value two. When this level of signal Ain is applied, reference cells RC1 and RC2 conduct, and reference cells RC3 to RC7 do not conduct. Initially, the count zero selects reference cell RC1. Reference cell RC1 conducts and causes inverter 728 to assert a high signal to latch 734. In the next clock cycle, the count one selects reference cell RC2. The reference cell RC2 conducts and causes inverter 728 to maintain the high signal to latch 734. In the following clock cycle, the count two selects reference cell RC3. Reference cell RC3 does not conduct and therefore causes inverter 728 to drop the signal to latch 734. The transition in the signal to latch 734 causes latch 734 to register the count signal from counter 732. Thus, digital output signal D represents the value two. Counting can continue or be stopped while latch 734 holds the output value.

Embodiments of ADCs that sequentially determine the conductivity of reference cells can be implemented in a variety of ways. For example, counter 732 in ADC 700 can be replaced with circuitry that performs a binary search for the boundary between conducting and non-conducting reference cells. An exemplary binary search starts at a central address (e.g., 4 for a 3-bit value) and increases or decreases the address depending on whether the reference cell at the current address conducts. The step size (e.g., initially 2) for each change in address decreases by half after each step. Such binary searching can reduce the maximum number of clock cycles required to find the output value, from $2^n-1$ to n.

Figure 7B:
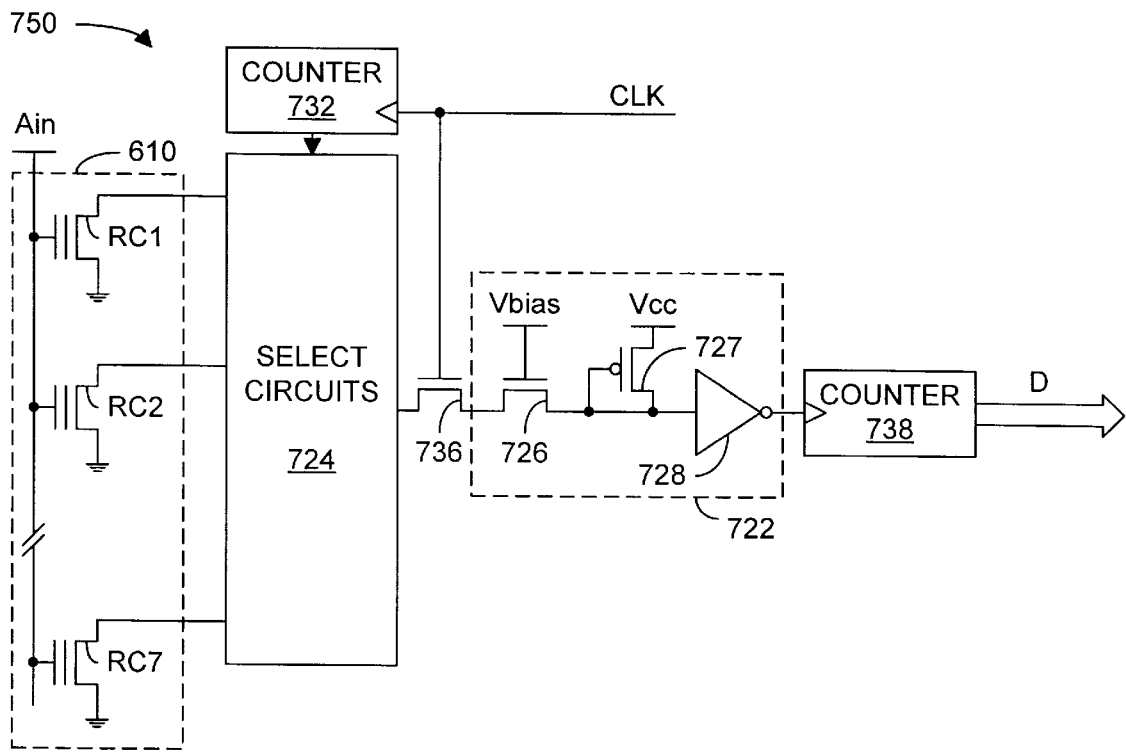

FIG. 7B illustrates alternative ADC 750 that also has select circuits 724 and sense circuit 722 sequentially select and sense the conductivity states of reference cells RC1 to RC1. ADC 750 differs from ADC 700 in that a counter 738, instead of latch 734, provides digital output signal D. In ADC 750, counters 732 and 738 are initially reset to zero. Counter 732, in response to a clock signal CLK, sequentially counts through the column addresses of array 610 so that select circuits 724 sequentially connect reference cells RC1 to RC7 to sense circuit 722. In particular, at a rising edge of signal CLK, counter 732 increments the address to select circuit 724, and sense circuit 722 connects to the selected reference cell via a transistor 736 and select circuits 724. If the selected reference cell conducts, the selected reference cell pulls down the voltage on the input terminal of inverter 728, and the output signal from inverter 728 is high. Transistor 736 has a gate coupled to signal CLK so that when signal CLK is low, transistor 736 disconnects sense circuit 722 from select circuits 724 and array 610, pull-up transistor 727 pulls up the input voltage to inverter 728, and the output signal from inverter 728 is low. Accordingly, sense circuit 722 generates a pulse for each reference cell RC1 to RC7 that conducts. Counter 738 counts pulses from sense circuit 722 and outputs the resulting count as signal D.

Another alternative ADC has a conversion array including a column of reference cells that are associated with a conversion. Instead of simultaneously applying analog input voltage Ain to all of the reference cells associated with a conversion, the ADC applies signal Ain only to reference cell (or one row of reference cells) at a time. For this embodiment, bias and select circuits include a row decoder to select the reference cell (or row of reference cells) to which signal Ain is applied. A sense circuit couples to the column line of the column associated with the conversion and to an encoder such as described above for FIGS. 7A and 7B.

Once the digital output signal D is obtained, signal D is then supplied to a DAC for conversion back to the analog domain with the desired conversion (e.g., a non-linear A-law or $\mu$-law characteristic, random, or any other conversion).

Figure 8:
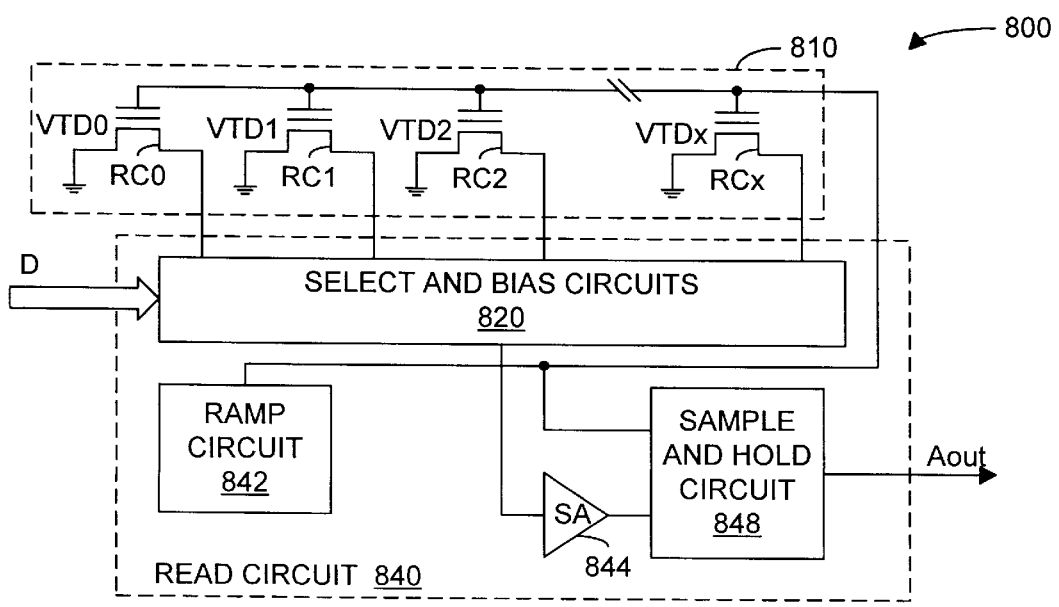
FIG. 8 is a block diagram of a programmable digital-to-analog converter in accordance with an embodiment of the invention.

FIG. 8 illustrates a DAC 800 suitable for use as DAC 430 of FIG. 4. DAC 800 includes a second non-volatile memory array 810 (sometimes referred to herein as a digital conversion array) containing reference cells RC0 to RCx that have been programmed with the appropriate threshold voltages VTD0 to VTDx for implementing the desired conversion. Note that if VTD0 to VTDx are different than VTA0 to VTAX, the converted analog signal Aout will be different than the input analog signal Ain. A read circuit 840 selects one of reference cells RC0 to RCx based on signal D and determines the threshold voltage of the selected reference cell. Reference cells RC0 to RCx are as described above in regard to FIG. 5, but in DAC 800, reference cells RC0 to RCx have sources grounded and drains coupled to select and bias circuits 820 in read circuit 840. For a conversion of the n-bit digital signal D, select circuit 820 interprets digital signal D as an address that identifies the selected reference cell. Read circuit 840 then determines the threshold voltage of the selected reference cell and provides analog output signal Aout at a voltage that is the same as (or alternatively depends on) the threshold voltage of the selected reference cell. Thus, the threshold voltage VTDi is equal to (or alternatively controls or has a one-to-one correspondence with) the voltage of analog output signal Aout, and programming of threshold voltages VTDi controls the conversion that DAC 700 implements.

Read circuit 840 can be any sort of circuit capable of reading a threshold voltage of a memory cell or transistor. However, in the specific embodiment shown in FIG. 8, read circuit 840 includes select and bias circuits 820, a ramp circuit 842, a sense amplifier 844, and a sample-and-hold circuit 848. For a digital-to-analog conversion, select circuit 820 responds to the multi-bit digital signal D from the ADC by: selecting the reference cell having an address corresponding to signal D; biasing the drain of the selected reference cell at a positive voltage, for example, 1 to 1.5 volts; and connecting the drain of the selected reference cell to sense amplifier 844. Ramp circuit 842, which is coupled to the row line of digital conversion array 810, ramps the control gate voltage of the selected reference cells between voltages Aout,min and Aout,max. Sense amplifier 844, which is coupled to the selected reference cell, senses when the selected reference cell transitions between a non-conducting and a conducting state and triggers sample-and-hold circuit 848 upon sensing the transition. In response to sense amplifier 844, sample-and-hold circuit 848 samples the control gate voltage from ramp circuit 842 and provides analog signal Aout with a voltage equal to or having a one-to-one correspondence with the sampled voltage. Thus, after some time delay, analog output signal Aout is about equal to or has a one-to-one correspondence with the threshold voltage of the selected reference cell. The resulting signal Aout, which is the desired transformation of input signal Ain, can be transmitted, stored, or further processed.

Although FIG. 8 shows a specific embodiment of read circuit 840, other types of read circuits that are capable of determining a threshold voltage can be used. U.S. Pat. No. 5,751,635, entitled "READ CIRCUITS FOR ANALOG MEMORY CELLS", U.S. Pat. No. 5,748,534, entitled "FEEDBACK LOOP FOR READING THRESHOLD VOLTAGES", U.S. Pat. No. 5,748,533, entitled "READ CIRCUIT WHICH USES A COARSE-TO-FINE SEARCH WHEN READING THE THRESHOLD VOLTAGE OF A MEMORY CELL", and U.S. patent app. Ser. No. 09/053,716, entitled "HIGH RESOLUTION MULTI-BIT-PER-CELL MEMORY", filed Apr. 1, 1998 describe some other suitable read circuits and are hereby incorporated by reference in their entirety.

Figure 9A:
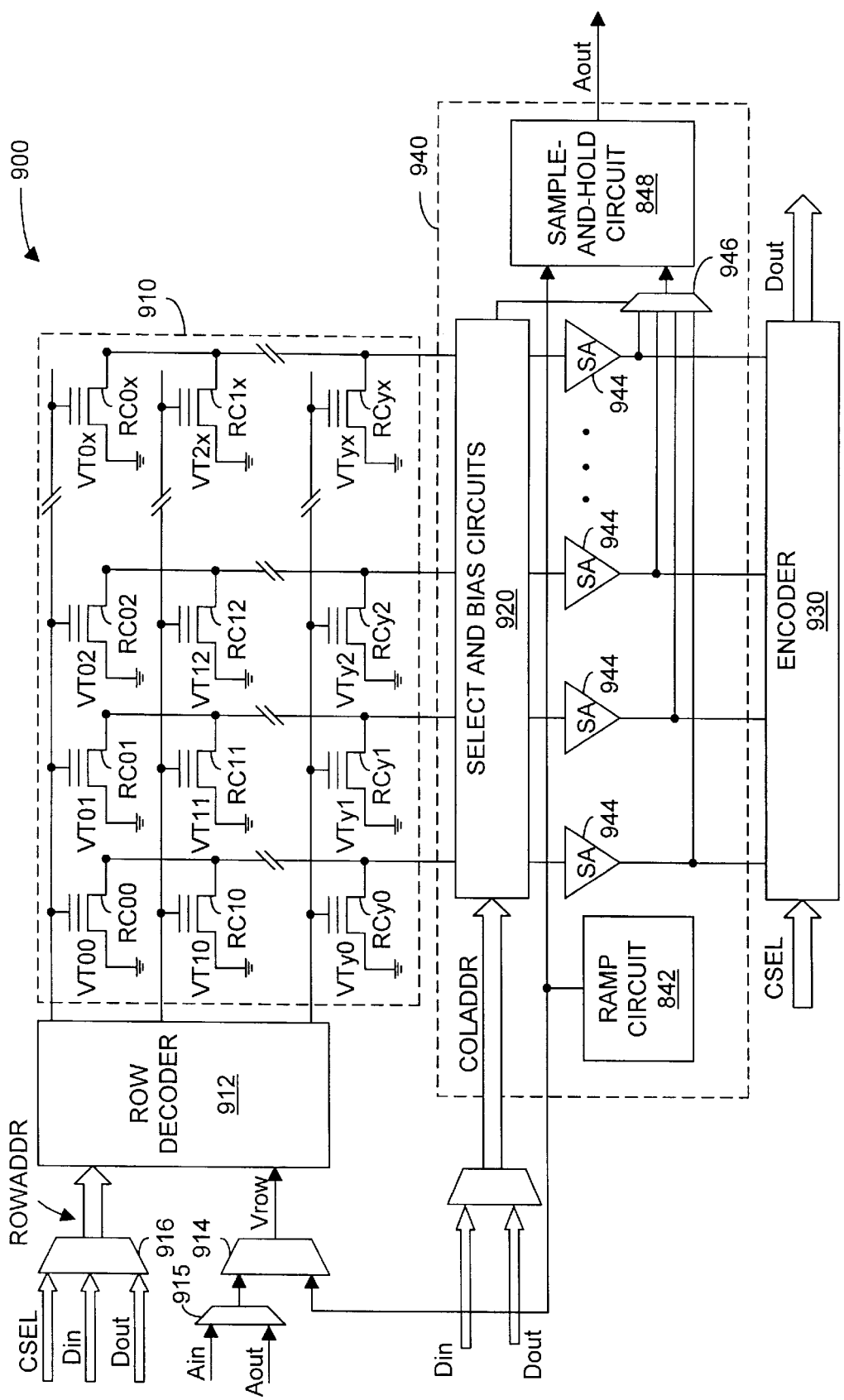
FIGS. 9A and 9B are block diagrams of combined analog-to-digital and digital-to-analog converters for analog-to-analog conversion according to an aspect of the invention.

In another embodiment of the present invention, an analog-to-analog converter (AAC) 900, shown in FIG. 9A, can be used to perform analog-to-analog conversion with a single memory array 910. AAC 900 performs two conversions, an analog-to-digital conversion followed by a digital-to-analog conversion. Array 910 includes rows 0 to y of reference cells RC00 . . . RC0x, RC10 . . . RC1x, . . . , RCy0 . . . RCyx having respective threshold voltages VT00 . . . VT0x, VT10 . . . VT1x, . . . , VTy0 . . . VTyx. Each row 0 to y has a row line which connects to the control gates of all the memory cells in the row. Reference cells RC00 to RCyx are also arranged into x+1 columns of reference cells RC00 . . . RCy0, RC01 . . . RCy1, . . . , RC0x . . . RCyx, where reference cells in a column have their drains coupled together by a column line corresponding to the column. In FIG. 9A, the sources of all of reference cells RC00 to RCyx are grounded, but alternatively, one or more source lines can connect the sources of reference cells RC00 to RCyx to erase circuits.

In one embodiment of AAC 900, each row 0 to y in memory array 910 is associated with a different conversion between analog and digital signals. For example, in row 0, threshold voltages VT00 to VT0x may define a linear conversion from analog input signal Ain to the digital output signal Dout, and threshold voltages VT10 to VT1x for row 1 may define a non-linear conversion such as a $\mu$-law or A-law compression from digital signal Din or Dout to the desired analog output Aout. A row decoder 912 selects from array 910 a row identified by a row address signal ROWADDR and applies a signal Vrow from a multiplexer 914 to the selected row. ROWADDR is selected from a conversion select signal CSEL, input address signal Din, or the output signal Dout of encoder 930. Multiplexer 914 provides analog input signal Ain or output signal Aout from multiplexer 915 as signal Vrow during an analog-to-digital conversion and provides a signal Vramp from ramp circuit 842 during a digital-to-analog conversion.

Figure 1:
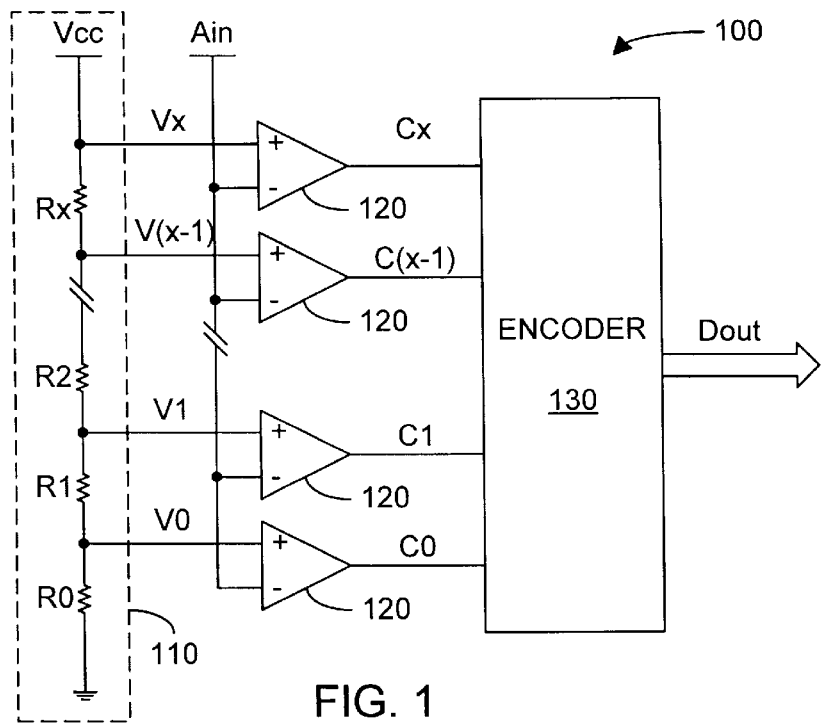
FIG. 1 is a block diagram of a known analog-to-digital converter.
Figure 2:
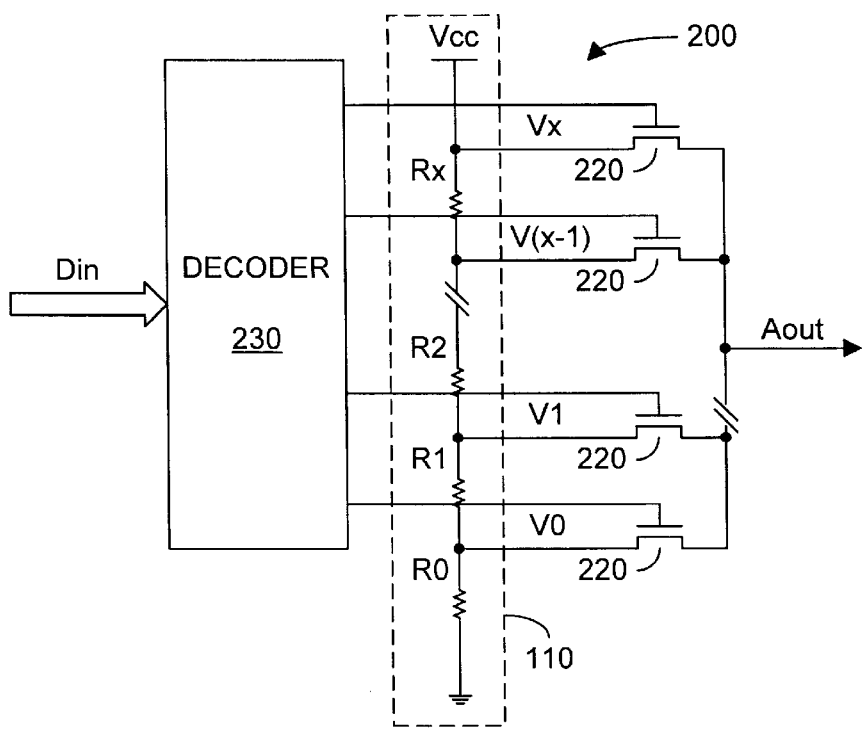
FIG. 2 is a circuit diagram of a known digital-to-analog converter.

To perform an analog-to-analog conversion with AAC 900, an analog-to-digital conversion is first performed. Multiplexer 914 selects analog input signal Ain, and row decoder 912 applies signal Ain to the row line corresponding to the selected conversion. Row decoder 912 biases unselected row lines to a voltage lower than the threshold voltage of any reference cell RC00 to RCyx in array 910 so that none of the reference cells coupled to unselected row lines conduct. Bias circuit 920 biases all of the column lines of array 910 to a positive voltage (typically 1 to 1.5 volts). Sense amplifiers 944 sense which of the column lines of array 910 couple to conductive reference cells, and each sense amplifier 944 asserts a binary signal indicating whether an associated reference cell in the selected row conducts. Encoder 930 generates output digital signal Dout from the binary signals as described above in regard to FIG. 1.

The resulting digital signal Dout is then used as an input to AAC 900 to perform a digital-to-analog conversion on signal Dout. Multiplexer 914 selects the signal from ramp circuit 842 (as discussed above with respect to FIG. 8), and row decoder 912 applies the selected signal from multiplexer 914 to the selected row line. Again, row decoder 912 biases unselected row lines to a voltage lower than the threshold voltage of any reference cell RC00 to RCyx in array 910 so that none of the reference cells coupled to unselected row lines conduct. Selection and bias circuit 920 biases all of the column lines or a selected column line of array 910 to a positive voltage, and each sense amplifier 944 senses whether the attached column line is coupled to a conductive reference cell. To save power, bias circuit 920 biases only the column line having the column address that signal Dout indicates. A multiplexer 946 selects the one of sense amplifiers 944 that is coupled to the column line having the column address that signal Dout identifies and provides the output binary signal from the selected sense amplifier as a trigger signal for sample-and-hold circuit 848. Accordingly, when the conductivity state of the reference cell in the selected row and the selected column changes, sample-and-hold circuit 848 samples the voltage from ramp circuit 842. Sample-and-hold circuit 848 provides the sampled voltage to analog output signal Aout, resulting in the desired analog-to-analog conversion.

In an alternative embodiment of AAC 900, multiple rows of array 910 contain reference cells for a single conversion. Using multiple rows for a conversion allows higher resolution analog signals and more bits in digital signals. In particular, an n-bit conversion requires about $2^n$ reference cells, and if the number of cells in a row is less than $2^n$, multiple row can be used for the conversion. Array 910 can still contain reference cells for many different types of conversions implemented with corresponding conversion arrays or tables.

For an analog-to-digital conversion using the alternative embodiment of AAC 900, signal CSEL initially has a value that selects one of the rows associated with the desired conversion, and circuit 940 determines the conductivity states of the reference cells in the current row. If all of the reference cells in the selected row conduct or do not conduct, control circuitry (not shown) changes signal CSEL to select another row corresponding to the desired conversion. The control circuit continues to change signal CSEL until a row is found in which some reference cells conduct and others do not conduct or until two rows that are consecutive in the conversion, are found where one row contains only conducting reference cells and the other row contains only non-conducting reference cells. Once signal CSEL selects the appropriate row, encoder 930 determines digital output signal Dout based on signal CSEL and on which reference cells in the selected row conduct. In particular, signal CSEL, which identifies a row, indicates the most significant bits of signal Dout and the conducting reference cells in the selected row indicate the least significant bits of signal Dout.

For a digital-to-analog conversion, signal CSEL selects the conversion (i.e., a set of rows corresponding to the conversion), and the most significant bits of digital signal Dout from the previous analog-to-digital conversion select the rows corresponding to the conversion. Accordingly, as shown in FIG. 9A, a mixer 916 provides to row decoder 912 an address signal ROWADDR having most significant bits from signal CSEL and least significant bits from signal Dout. The least significant bits of digital input signal Dout select which column of array 910 is read to provide analog output signal Aout. In FIG. 9A, the read circuit includes a ramp circuit 842 that multiplexer 914 and row decoder 912 connect to the selected row line.

Figure 9B:
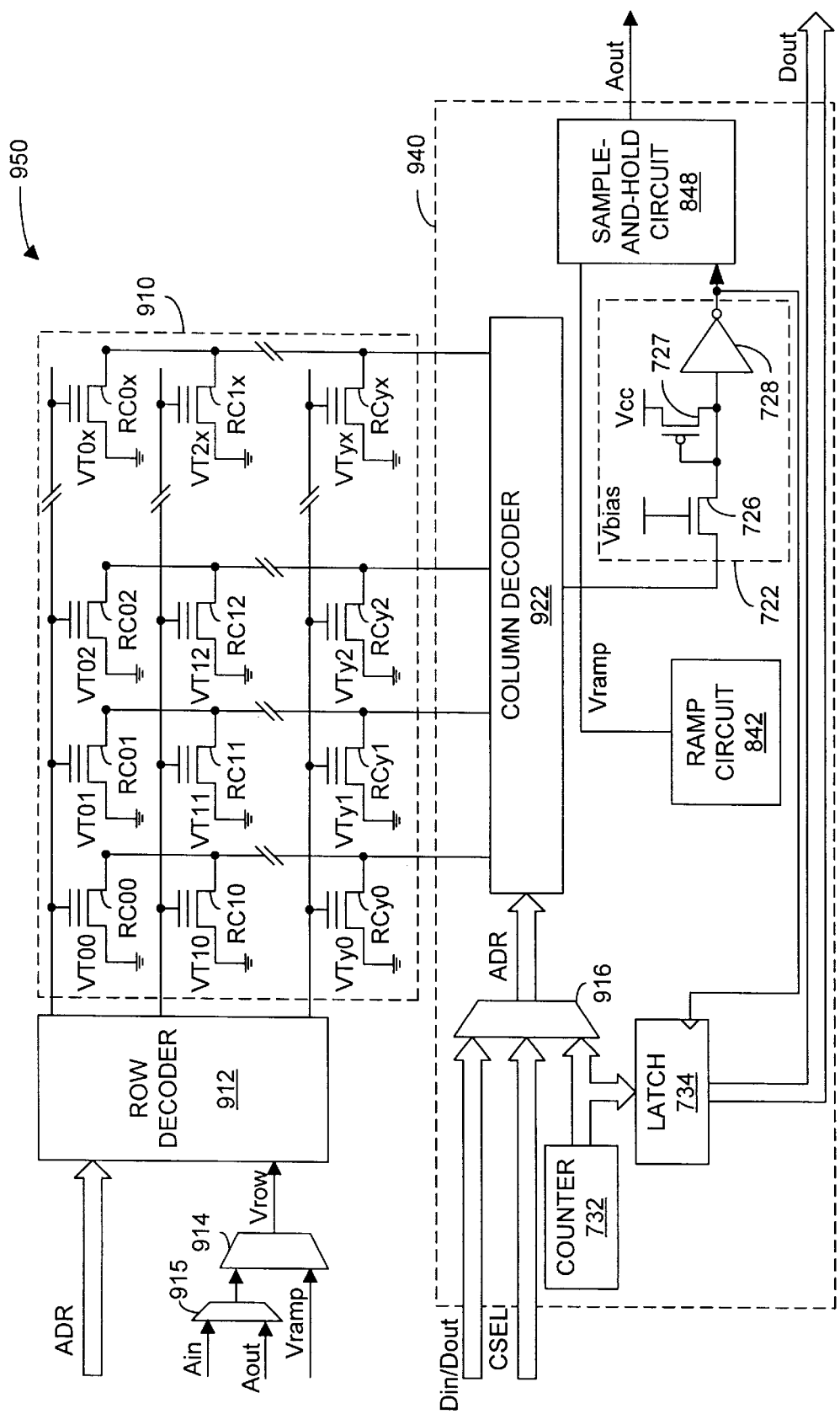

FIG. 9B illustrates an AAC 950 which is similar to AAC 900 but uses a single sense circuit 722 to reduce circuit area and power consumption. AAC 950 also uses encoding as described above in regard to FIG. 7A. During an analog-to-digital conversion, counter 732 increments through the possible digital values for the digital signal, and signal CSEL identifies a set of the rows associated with the conversion being performed. Accordingly, mixer 916 generates an address signal ADR that is applied to row decoder 912 and a column decoder 922 to sequentially select reference cells corresponding to the conversion. In particular, after a column address to column decoder 922 counts across a row, row decoder 912 changes the row line to which analog input signal Ain is applied. At the dividing point between conductive and non-conductive reference cells, latch 734 registers the count from counter 732 and provides that count as digital output signal Dout.

Signal Dout is then converted to the desired analog format by applying signal Dout back to the input of read circuit 940. Signal CSEL identifies the set of rows corresponding to a conversion, and digital signal Dout identifies a reference cell that corresponds to the digital value. Accordingly, address signal ADR from mixer 916 is a combination of signals Dout and CSEL that selects the reference cell from the set of row signal CSEL identifies. Column decoder 922 connects that reference cell to sense circuit 722 which triggers sample-and-hold circuit 848 when required to provide the desired analog output signal Aout at the level of the threshold voltage of the target reference cell.

The resulting analog signal Aout is not necessarily the same as the input signal Ain. In other words, signal Aout can correspond to a non-linear, high-level shift, low-level shift, or random mapping of input signal Ain. Such conversions of Ain to Aout can be beneficial for a variety of applications. For example, for voice or audio applications, non-linear logarithmic µ-law and A-law compression schemes can improve the quality of audio signal transmissions because such compressions improve the signal-to-noise ratio and lessen the quantization errors of low amplitude voice signals. Proper programming of the threshold voltages in reference cells RC0 to RCx can implement a µ-law or A-law function or any other desired mapping.

Figure 3:
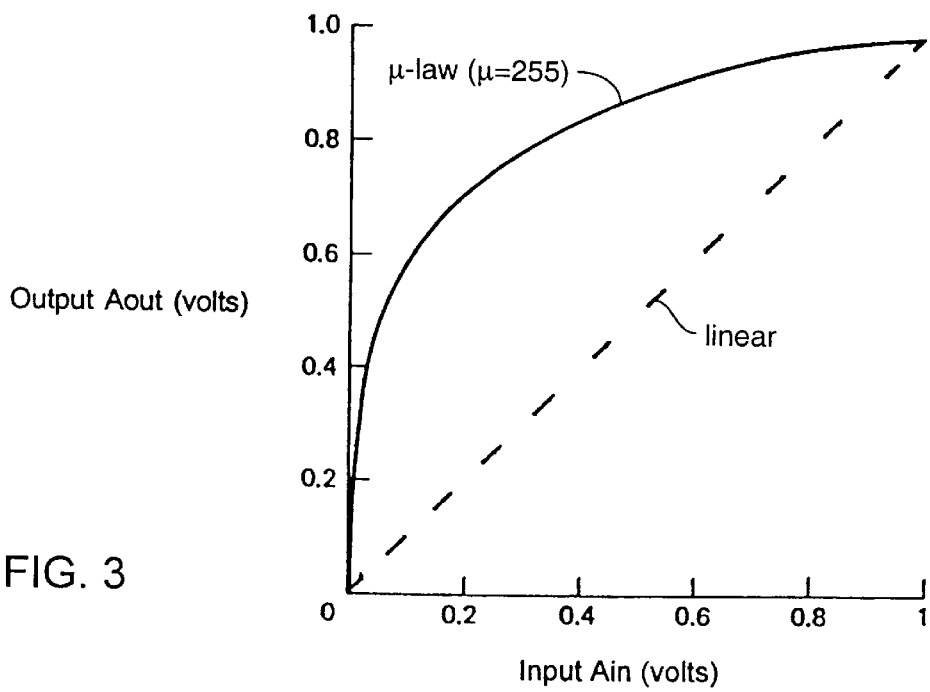
FIG. 3 is a characteristic conversion curve of a $\mu$-law compression for $\mu=255$.

A logarithmic mapping, such as µ-law, produces output signals having relatively higher resolution per quantized level for low level signals than for high level signals. The characteristic mapping for µ-law, which is adopted for use with digital carrier transmission systems in North America, is given by $$Aout = \frac{V \ln(1 + \mu Ain/V)}{\ln(1 + \mu)} \quad (1)$$

where V is the maximum voltage of the input analog voltage Ain, µ is a constant (µ=255 for the North America standard), and Aout is the compressed output analog voltage. A normalized plot of equation (1) is shown in FIG. 3 (i.e., for V=1 volt, Ain ranges from 0 to 1 volt, and µ=255). Thus, the reference cells RC0 to RCx can be programmed with the threshold voltages corresponding to the values of Aout for various input voltages Ain according to equation (1) to realize a µ-law compression. In general, the input voltages used to calculate the corresponding Aout voltages are divided up equally, given by $$Ain,min+(Ain,max-Ain,min)*i/x$$

where Ain,min is the minimum voltage of the input signal, Ain,max is the maximum voltage of the input signal, x+1 is the number of reference cells, and i ranges from 0 to x. An illustrative example in Table 2 below lists the input voltages and corresponding output voltages for Ain,min=0 volts, Ain,max=1 volt, x=10 (i.e., 11 reference cells), and µ=255.

TABLE 2

| Ain | Aout |
|-----|------|
| 0   | 0    |
| 0.1 | 0.590 |
| 0.2 | 0.713 |
| 0.3 | 0.785 |
| 0.4 | 0.836 |
| 0.5 | 0.876 |
| 0.6 | 0.908 |
| 0.7 | 0.936 |
| 0.8 | 0.960 |
| 0.9 | 0.981 |
| 1.0 | 1.0  |

Thus, with appropriate threshold voltages programmed into the reference cells of the memory array, an analog-to-analog conversion of an input analog signal Ain to a logarithmically compressed output analog signal Aout can be obtained.

More generally, threshold voltages VTi according to equation (2) below implement a conversion where the value that signal Aout represents is equal to a function F of the voltage of signal Ain.

$$VTi=F(Ain,min+(Ain,max-Ain,min)*i/x) \quad (2)$$

Generally, over its range, function F should have a single-valued inverse for an invertable conversion. With other types of conversion functions, analog data can be transmitted which has been encrypted according to the conversion defined by the threshold voltages of memory cells in the conversion array. The encrypted signal, which may be quantized into a digital data stream, can then be transmitted securely over public communication channels. Upon receipt at the desired destination, the encrypted signal is decrypted using an inverse of the conversion array. Because the conversion arrays can be programmed with threshold voltages representing a large number of functions and/or random mappings (i.e., a encryption code), the transmitted signal will be extremely difficult to decode if intercepted, resulting in secure communications. Since the encryption code is stored in the floating gate of the memory cells as electrons, deciphering the encryption code through reverse engineering is essentially impossible. Also, since the conversion array or table can be modified to change the encryption at any time by remote means, such as over phone lines with programming capabilities, secure transmission is virtually guaranteed. For example, the encryption code can be changed just prior to any transmission where security is desired so that knowledge of the prior encryption code is rendered useless.

Threshold voltages for implementing desired conversions can be programmed in analog/multi-level memory arrays, such as described in commonly-owned U.S. Pat. No. 5,694,356, entitled "HIGH RESOLUTION ANALOG STORAGE EPROM AND FLASH EPROM", U.S. Pat. No. 5,680,341, entitled "PIPELINED RECORD AND PLAYBACK FOR ANALOG NON-VOLATILE MEMORY", and U.S. Pat. No. 5,818,757, entitled "ANALOG AND MULTI-LEVEL MEMORY WITH REDUCED PROGRAM DISTURB", and in commonly-owned U.S. patent app. Ser. No. 08/781,741, entitled "SOURCE BIASING IN NON-VOLATILE MEMORY HAVING ROW-BASED SECTORS" and U.S. patent app. Ser. No. 08/889,111, entitled "MULTIPLE ARRAY ARCHITECTURE FOR ANALOG OR MULTI-LEVEL MEMORY", all of which are incorporated by reference in their entirety.

Figure 10A:
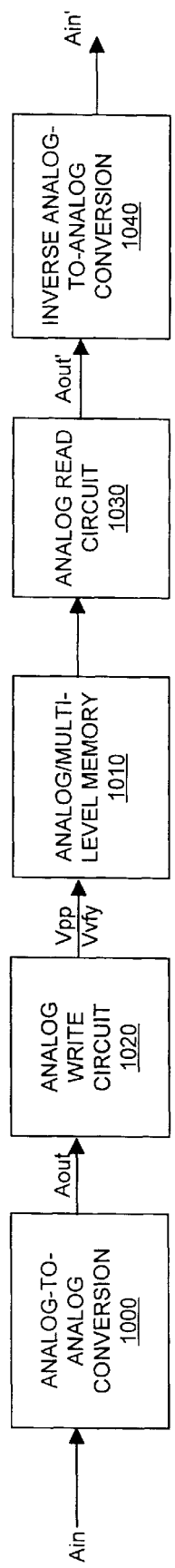
FIGS. 10A and 10B are block diagrams of systems utilizing converted analog signals.

Once Aout has been converted to the selected format, Aout can be further processed as desired. For example, Aout can be stored in a memory (recording) and read out at a later time (playback), as shown in FIG. 10A. Input analog signal Ain is converted to a logarithmic (or any other desired conversion) analog output signal Aout by an analog-to-analog converter 1000, such as described above. Signal Aout is then stored in an analog/multi-level memory 1010, such as those described in the references above.

Analog signal Aout is stored into analog/multi-level memory 1010 via an analog write circuit 1020, such as described in commonly-owned U.S. Pat. No. 5,687,115, entitled "WRITE CIRCUITS FOR ANALOG MEMORY", which is incorporated by reference in its entirety. Analog write circuit 1020, for example, includes a high voltage shifter for generating a write voltage Vpp corresponding to a shifted voltage of analog signal Aout. Voltage Vpp is applied to the control gate of a selected memory cell in analog/multi-level memory 1010 to raise the threshold voltage of the memory cell. A voltage Vvfy, representing the voltage of Aout, is then applied to the selected memory cell to read or verify the threshold voltage of the memory cell. If the memory cell conducts, indicating a threshold voltage lower than Vvfy, then another write cycle is performed to increase the memory cell's threshold voltage. However, if the memory cell does not conduct, indicating that the threshold voltage is at or above Vvfy, then further writing to the memory cell is stopped, resulting in the selected memory cell being programmed with the voltage of Aout. Write and verify cycles are continued until Aout is properly programmed into analog/multi-level memory array 1010. The converted or compressed analog signal Aout can then be stored in memory array 1010 for later playback.

Figure 10B:
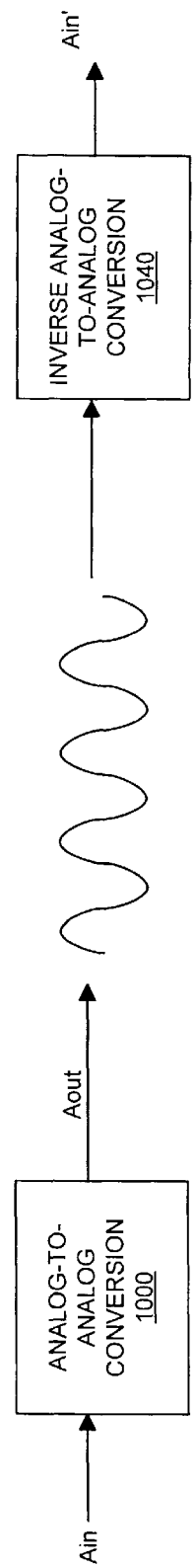

Upon playback, the threshold voltages of memory cells in array 1010 are read by an analog read circuit 1030. Examples of suitable read circuits are described in commonly-owned U.S. Pat. No. 5,751,635, entitled "READ CIRCUITS FOR ANALOG MEMORY CELLS", which is incorporated by reference in its entirety. One type of read circuit 1030 slowly changes or ramps a control gate voltage asserted to a selected memory cell and then samples and holds the control gate voltage when the selected memory cell first conducts. The sampled control gate voltage is equal to or has a one-to-one correspondence with the threshold voltage of the selected memory cell, which is equal to or can be converted to the analog signal stored in the memory cell. The stored analog signal Aout' is then converted back to the analog signal format of the original signal Ain by an inverse analog-to-analog converter 1040. Converter 1040 utilizes circuits and methods similar to those described above, with the exception that the memory array in converter 1040 implements the inverse function of the original conversion, i.e., the memory cells forming the array are programmed with threshold voltages that are the inverse of the threshold voltages of the memory cells in the original conversion array. As a result, the output of converter 1040, Ain', is a reconstructed analog signal of Ain, where signal Ain' is in the same format as Ain. For example, converter 1040 acts to decipher signal Aout' after encryption in converter 1000, as shown in FIG. 10B. Thus, after encryption, the analog signal Aout, such as a voice signal, can be transmitted securely until reaching its desired destination, such as a deciphering device with a built-in inverse analog-to-analog converter 1040. Upon applying the inverse conversion, signal Aout is deciphered or converted back to its original format.

Figure 11:
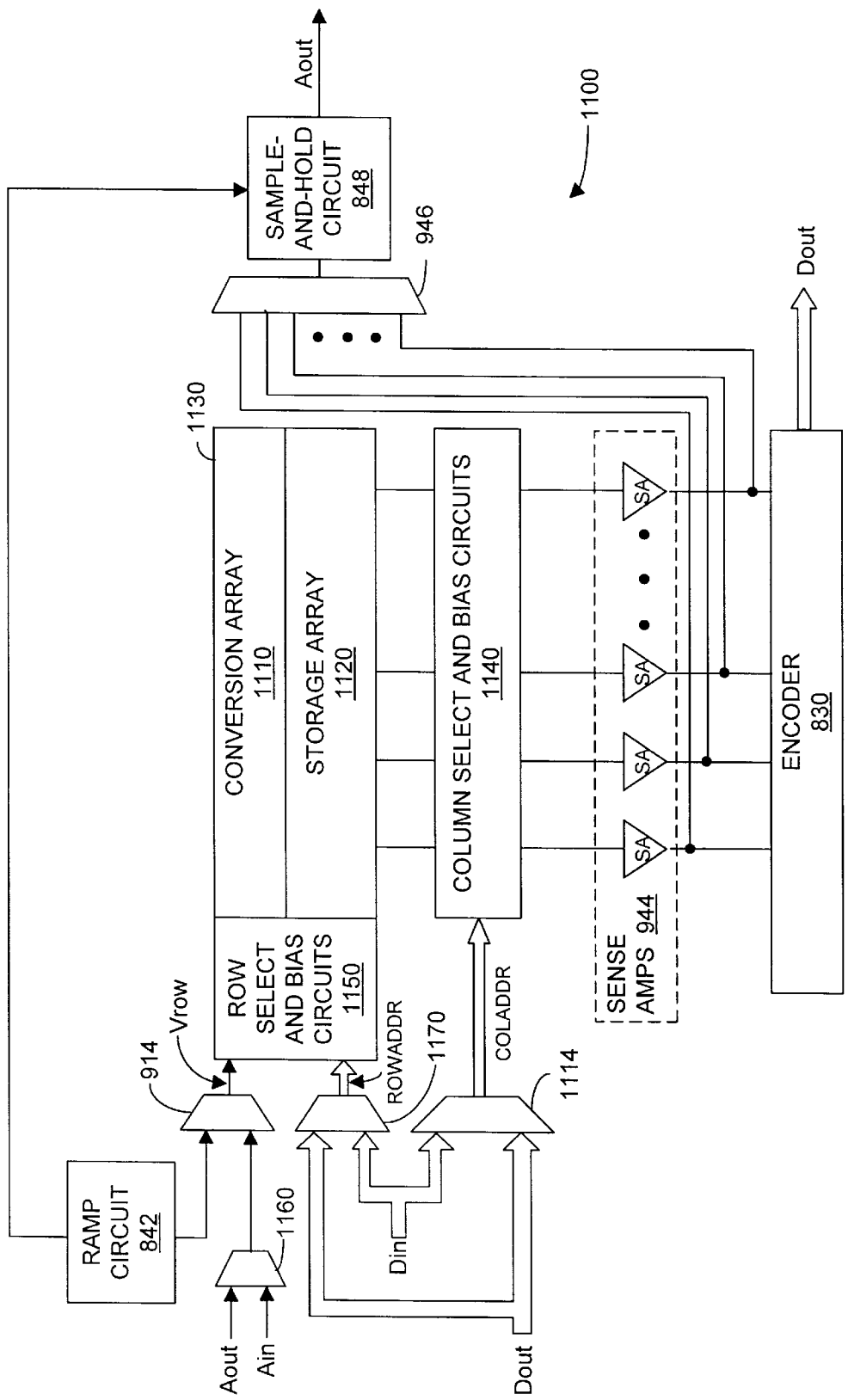
FIG. 11 is a block diagram of an analog-to-analog converter utilizing a single memory array having a conversion array and a storage array.

In another embodiment of an AAC, shown in FIG. 11, a memory system 1100 includes a conversion array 1110 having both analog-to-digital and digital-to-analog conversion and a storage or memory array 1120 within a single larger memory array 1130. In an exemplary embodiment of memory system 1100, array 1130 is a conventional Flash memory array including erasable sectors of memory cells. Preferably, memory cells in either array are erasable without affecting the contents of the other array. Conversion array 1110, for example, as described above with respect to FIGS. 9A and 9B, contains one or more rows of memory cells where each row contains reference cells with threshold voltages programmed for a conversion corresponding to the row. Typically, the content of conversion array 1110 is fixed or is changed less often than the content of storage array 1120.

Connected to array 1130 are a column decoder 1140 and a row decoder 1150. Such column and row decoders are well known in conventional memory systems and select column and row lines as required to access particular memory cells. A ramp or row line bias circuit 842 generates the signal that row decoder 1150 applies to a selected row line when reading the threshold voltage of a selected memory cell on the selected row line. Column decoder 1140 includes bias circuits and control circuits that apply voltages to column lines as required for erase, programming, and read operations, which are not shown for ease of illustration. Such bias and control circuits are well known for non-volatile memories.

Storage array 1120 contains non-volatile memory cells for storing analog voltages in an analog format. In particular, to write an analog data value to a selected memory cell in storage array 1120, a user provides a data signal Ain and an address signal to memory 1100 through I/O ports (not shown). A user can also provide a conversion select signal CSEL (not shown for simplicity), such as described above with reference to FIGS. 9A and 9B, to select a type of conversion and corresponding row in the conversion array 1110. The write process then proceeds in three steps: an analog-to-digital conversion step, a digital-to-analog conversion step, and a programming step. The combination of the analog-to-digital conversion and the digital-to-analog conversion implements a desired transformation of analog input signal Ain to analog output signal Aout, as described above. During the programming step, the threshold voltage of the selected memory cell is written to the same voltage as signal Aout.

For the analog-to-analog conversion, the address signal or the conversion select signal CSEL identify a selected reference cell in conversion array 1110. Signals ROWADDR and COLADDR are applied to row decoder 1150 and column decoder 1140 through respective multiplexers 1170 and 1114 to select the row and column, respectively, containing the desired reference cell. ROWADDR and COLADDR are selected from either the input address signal Din or the output signal Dout of the encoder 830, with ROWADDR also depending on the type of conversion desired (i.e., CSEL, not shown) within conversion array 1110. After conversion to the desired analog signal Aout, such as described in detail above, signal Aout can then be stored in designated memory cells in storage array 1120.

For the programming step, the input address signal Din identifies a selected memory cell in storage array 1120. To make the existence of conversion array 1110 transparent, row address ROWADDR includes a separate bit which memory 1100 sets when accessing conversion array 1110. Accordingly, the input address signal need not account for the existence or size of conversion array 1110. Signals ROWADDR and COLADDR are derived from the input address signal and respectively applied to row decoder 1150 and column decoder 1140 to select a row line and a column line in array 1130. Row decoder 1150 and column decoder 1140 then apply signals to the selected row and column lines to program the selected memory cell to a threshold voltage equal to or having a one-to-one correspondence with analog signal Aout through a multiplexer 1160. Many write processes are known and suitable for programming the selected memory cell to the target threshold voltage.

An exemplary write process performs a series of programming cycles and verify cycles on the selected memory cell. During a programming cycle, column decoder 1140 applies a high voltage (typically 5–6 volts) to the selected column line, and row decoder 1150 applies a high voltage Vpp (8–12 volts) to the selected row line. Row decoder 1150 generates the row line voltage (not shown) at a level that is linearly or otherwise dependent on analog signal Aout so that programming cycles for a higher target voltage Aout use a higher programming voltage. Verify cycles determine whether the threshold voltage of the selected memory cell has reached the target voltage Aout. This can be achieved by applying voltage Vvfy, which is proportional to Aout, to the selected row line, applying a voltage of approximately 1.5 volts to the selected column line, and sensing whether the selected memory cell conducts. The selected memory cell stops conducting upon reaching the target threshold voltage, and the write operation is terminated.

The stored analog voltages can be accessed through a threshold voltage determination. For threshold voltage determination, signals COLADDR and ROWADDR identify a selected column line and a selected row line for a memory cell in storage array 1120. Column decoder 1140 biases the selected row line to a positive voltage. Row decoder 1150 and ramp circuit 842 ramp the voltage on the selected row line, and the sense amplifier 944 coupled to the selected column line triggers sample-and-hold circuit 848 when the selected memory cell begins to conduct. At this point, analog signal Aout has a voltage about equal to or having a one-to-one correspondence with the threshold voltage of the selected memory cell, and the determination step is complete. Signal Aout can then be used for further processing or transmission or can be converted again to another format, such as reconversion back to the original signal format.

For another conversion, signal ROWADDR identifies a conversion according to the conversion select signal (not shown) and causes row decoder 1150 to select a row line in conversion array 1110 for implementing the desired conversion. For example, with playback of audio signals, as discussed above, the desired conversion can be an inverse of the original logarithmic conversion. In this case, signal ROWADDR selects the row containing memory cells programmed with threshold voltages that are the inverse of the original conversion array. Thus, multiple sequential conversions can be performed with a single large memory array. This technique allows multiple levels of encryption on a signal, which may be desirable in some applications as opposed to a single encryption or conversion.

As described above, memory 1100 has a single memory array which is partitioned into conversion array 1110 and storage array 1120. Alternatively, conversion array 1110 and storage array 1120 can be separate structures to allow simultaneous access of arrays 1110 and 1120. With separate conversion and storage arrays, a series of read operations or a series of write operations can be pipelined to provide a higher data flow rate, such as described in commonly-owned U.S. Pat. No. 5,680,341, entitled "PIPELINED RECORD AND PLAYBACK FOR ANALOG NON-VOLATILE MEMORY" to Wong et al., which is incorporated by reference in its entirety. For example, for writing a series of multi-bit values, the programming step for each write in the series can be performed simultaneously with the conversion step for the next write in the series. Thus, the total time for the series of writes is approximately equal to the product of the number of values and the time required for the programming step, and the throughput of the memory is increased.

However, with analog-to-digital and/or digital-to-analog conversion, operation of the memory systems primarily involves reading the memory cells, which is much faster than writing to the memory cells, i.e., reading typically requires less than 1 $\mu$sec. Thus, the operation of the memory systems are slowed when performing non-reading operations, such as when a new conversion is desired, which requires writing or programming new threshold voltages in the memory cells. Because such situations arise are much less frequently than an analog-to-digital or digital-to-analog conversion, these converters have very high operational speeds.

Other than analog-to-analog conversion and the storage of analog/multi-level data, memory system 1100 can also be used to store conventional digital data. For example, signals Ain and Aout have two discrete levels, high and low, instead of a range of analog values. Additionally, memory system 1100 can be used as a conventional analog-to-digital or digital-to-analog converter provided that the conversion array includes linear rather than non-linear conversion tables.

Although the invention has been described with reference to particular embodiments, the description is only an example of the invention's application and should not be taken as a limitation. For example, although the above embodiments describe encoding the binary outputs T0 to Tx from sense circuits to obtain a digital output, these binary outputs can be used to directly select the desired reference cells for the subsequent analog conversion. Thus, various adaptations and combinations of features of the embodiments disclosed are within the scope of the invention as defined by the following claims.

I claim:

1. A converter comprising:

an analog-to-digital converter (ADC) for converting an analog input signal to a digital signal; and a digital-to-analog converter (DAC) for converting the digital signal to an output analog signal different than the analog input signal, wherein the DAC comprises a first plurality of memory cells having a first plurality of different threshold voltages, the threshold voltages of the memory cells representing the digital to analog conversion.

2. The converter of claim 1, wherein the analog output signal is a non-linear conversion of the analog input signal.

3. The converter of claim 2, wherein the non-linear conversion is a logarithmic conversion.

4. The converter of claim 3, wherein the non-linear conversion is a $\mu$-law or A-law conversion.

5. The converter of claim 1, further comprising a second converter for converting the analog output signal to a second analog output signal.

6. The converter of claim 5, wherein the second converter performs a conversion which is the inverse of the conversion from the analog input signal to the analog output signal.

7. The converter of claim 1, wherein the DAC comprises:

a read circuit capable of reading a threshold voltage of a memory cell and generating the analog output signal that has a voltage representing the threshold voltage read; and a select circuit coupled to the first plurality of memory cells and the read circuit, wherein the select circuit selects which of the first plurality of memory cells the read circuit reads, the selection being according to the digital signal.

8. The converter of claim 7, wherein the ADC comprises:

a second plurality of memory cells having a second plurality of different threshold voltages;

an input terminal coupled to apply the analog input signal to gates of the second plurality of memory cells; and a sense circuit coupled to the second plurality of memory cells, wherein the sense circuit generates the digital signal, the digital signal depending on which of the second plurality of memory cells conducts when the analog input signal is applied.

9. The converter of claim 1, wherein the analog output signal is a random conversion of the analog input signal.

10. The converter of claim 1, wherein the first plurality of memory cells forms a programmable analog/multi-level memory array.

11. An analog-to-analog converter comprising:

an array of reference cells, the reference cells having a plurality of different threshold voltages;

a sense circuit coupled to the array;

an encoder coupled to the sense circuit, wherein the encoder generates a digital signal that represents a value that depends on which of the reference cells conduct when an analog input signal is applied to a set of reference cells;

a plurality of memory cells coupled to the digital signal and having a plurality of different threshold voltages;

a read circuit capable of reading a threshold voltage of a memory cell and generating an analog output signal that has a voltage representing the threshold voltage read, wherein the analog output signal is different than the analog input signal; and a select circuit coupled to the plurality of memory cells and the read circuit, wherein the select circuit selects which of the plurality of memory cells the read circuit reads, the selection being according to the digital signal.

12. The converter of claim 11, wherein the array contains a plurality of rows, and the converter further comprises a row decoder coupled to the array, the row decoder selecting a row of reference cells to which the analog input signal is applied.

13. The converter of claim 12, further comprising a terminal for a conversion select signal that selects from among a plurality of conversions that the converter implements, the terminal being coupled to provide at least a portion of an address signal to the row decoder.

14. The converter of claim 13, wherein each row in the array corresponds to a different conversion.

15. The converter of claim 14, wherein at least one conversion in the plurality of conversions corresponds to multiple rows in the array.

16. The converter of claim 12, further comprising:

a column decoder coupled to column lines of the array;

an input terminal for a digital signal, the input terminal coupled to provide a first portion of the digital signal as a row address signal that the row decoder uses to select a row of the array and to provide a second portion of the digital signal as a column address signal that the column decoder uses to select a column of the array; and a read circuit coupled to read a threshold voltage of a reference cell in the row selected by the row decoder and the column selected by the column decoder, the read circuit generating the analog output signal, the analog output signal having a level representative of the threshold voltage of the reference cell read.

17. The converter of claim 11, wherein the encoder comprises a counter coupled to the sense circuit to count pulses from the sense circuit, the digital signal being a count of the number of reference cells that conduct.

18. A method of converting an analog input signal to an analog output signal comprising:

converting the analog input signal to a digital signal;

applying the digital signal to a plurality of analog/multi-level memory cells; and reading the threshold voltage of the memory cell corresponding to the digital signal, wherein the analog output signal is representative of the read threshold voltage and is different than the analog input signal.

19. The method of claim 18, further comprising converting the analog output signal to a second analog output signal.

20. The method of claim 19, wherein the conversion to the second analog output signal is an inverse conversion of the conversion from the analog input signal to the analog output signal.

21. The method of claim 18, wherein said converting comprises:

applying the analog signal to control gates of a plurality of memory cells;

determining which of the plurality of memory cells conduct; and generating the digital signal having a value that depends on which of the plurality of memory cells conduct.

22. The method of claim 18, further comprising programming the memory cells with threshold voltages corresponding to a non-linear conversion of the digital signal to the analog output signal.

23. The method of claim 18, wherein the non-linear conversion corresponds to a $\mu$-law or A-law conversion.

24. The method of claim 18, further comprising programming the memory cells with random threshold voltages.

25. A method of converting an analog input signal to an analog output signal, comprising:

applying the analog input signal to a first row of memory cells;

sensing which of the memory cells conduct when the analog input signal is applied;

generating a digital output signal from the memory cells that conduct;

applying the digital output signal to a second row of memory cells; and reading the threshold voltage from the memory cell in the second row that corresponds to the digital output signal, wherein the threshold voltage is representative of the analog output signal, which is different than the analog input signal.

26. The method of claim 25, further comprising transmitting the analog output signal and converting the analog output signal to a second analog output signal the same format as the analog input signal.

27. The method of claim 26, wherein the converting to the second analog output signal comprises:

applying the analog output signal to a third row of memory cells;

sensing which of the memory cells conduct when the analog output signal is applied;

generating a digital signal from the memory cells that conduct;

applying the digital signal to a fourth row of memory cells; and reading the threshold voltage from the memory cell in the fourth row that corresponds to the digital signal, wherein the threshold voltage is representative of the second analog output signal, which is the same format as the analog input signal.

28. A converter comprising:

a first array of memory cells;

a circuit that applies an analog input signal to control gates of memory cells in the first array;

an encoder coupled to the first array, wherein the encoder generates a digital output signal having a value determined by which of the memory cells in the first array conduct when the analog input signal is applied;

a read circuit coupled to read a selected one of the memory cells in the first array and generate an analog output signal representative of the threshold voltage of the memory cell read, wherein the analog output signal is different than the analog input signal; and a second array of memory cells for storing the analog output signal.

29. The converter of claim 28, wherein the analog output signal is a non-linear conversion of the analog input signal.

30. The converter of claim 29, wherein the non-linear conversion is a logarithmic conversion.

31. A converter comprising:
   a first array of memory cells for storing data values;
   a second array of memory cells that includes a plurality of row lines, each row line coupled to the control gates of memory cells in the row;
   a first selection circuit coupled to the row lines in the second array, the selection circuit receiving an analog input signal and a row address signal, wherein in response to the row address signal the selection circuit selects a row line to apply the analog input signal;
   a sense circuit coupled to the second array, wherein the sense circuit generates a digital signal, the digital signal depending on which of the memory cells in the second array conducts when the first analog signal is applied;
   a second selection circuit coupled to the column lines in the second array, the selection circuit receiving the digital signal, wherein in response to the digital signal the selection circuit selects a column line that corresponds to the data value; and
   a read circuit coupled to read a memory cell that is in the second array and coupled to the column line that the selection circuit selects, the read circuit generating an analog output signal representing the threshold voltage of the memory cell read, wherein the analog output signal is different than the analog input signal.

32. The converter of claim 31, further comprising a write circuit coupled to receive the analog output signal from the read circuit and program a threshold voltage of a memory cell in the first array to the threshold voltage that the analog output signal indicates.

33. The converter of claim 31, wherein the first array and the second array are separate, and the read circuit and write circuit can operate simultaneously without interfering with each other.

34. The converter of claim 31, wherein the first array and the second array are portions of a larger array.

35. The converter of claim 31, wherein the read circuit is coupled to read a selected one of the memory cells in the first array, and the converter further comprises:
   a circuit that applies the analog output signal from the read circuit to control gates of memory cells in the second array after the read circuit has read the selected memory cell in the first array; and
   an encoder coupled to the second array, wherein the encoder generates a digital output signal having a value determined by which of the memory cells in the second array conduct when the analog output signal is applied.

* * * * *